US012740437B2

(12) United States Patent
Otaki et al.

(10) Patent No.: US 12,740,437 B2
(45) Date of Patent: Sep. 15, 2026

(54) LEAD FRAME

(71) Applicant: Ohkuchi Materials Co., Ltd., Isa (JP)

(72) Inventors: Keiichi Otaki, Isa (JP); Naoki Haruzono, Isa (JP); Ichinori Iidani, Isa (JP)

(73) Assignee: CHANG WAH TECHNOLOGY CO., LTD., Kaohsiung City (TW)

( * ) Notice: Subject to any disclaimer, the term of this patent is extended or adjusted under 35 U.S.C. 154(b) by 343 days.

(21) Appl. No.: 18/237,011

(22) Filed: Aug. 23, 2023

(65) Prior Publication Data

US 2024/0371733 A1 Nov. 7, 2024

(30) Foreign Application Priority Data

May 2, 2023 (JP) ................................ 2023-076372

(51) Int. Cl.
*H10W 70/40* (2026.01)

(52) U.S. Cl.
CPC ....... *H10W 70/451* (2026.01); *H10W 70/421* (2026.01); *H10W 70/457* (2026.01); *H10W 70/458* (2026.01)

(58) Field of Classification Search
CPC ......... H01L 23/49534; H01L 23/49541; H01L 23/49582; H01L 23/49586; H01L 21/4821; H01L 21/4828; H10W 70/451; H10W 70/421; H10W 70/457; H10W 70/458; H10W 70/04; H10W 70/042
See application file for complete search history.

(56) References Cited

U.S. PATENT DOCUMENTS

2004/0207056 A1* 10/2004 Seki ........................ H01L 24/48 257/676
2011/0221052 A1* 9/2011 Imanishi ........... H01L 23/49586 427/125
2022/0208664 A1 6/2022 Hayashi
2024/0145356 A1* 5/2024 Nagata ................ H01L 23/3142
2024/0312868 A1* 9/2024 Hatori ................... H01L 23/367

FOREIGN PATENT DOCUMENTS

JP 2016-105432 A 6/2016
JP 2021-19095 A 2/2021
JP 2022-103594 A 7/2022
WO 2023/033126 A1 3/2023

* cited by examiner

*Primary Examiner* — Jonathan Han
(74) *Attorney, Agent, or Firm* — WHDA, LLP

(57) ABSTRACT

A lead frame formed of a plate-shaped copper material, at least one surface of which being smooth, comprising: a predetermined connection plating layer being provided at a portion to be connected for conduction of a semiconductor element on the smooth surface of the plate-shaped copper material; a portion where the smooth surface of the copper material exposed in an annular shape being provided around the connection plating layer; and an anodic oxide film of the copper material being provided at other portions. With this composition, the lead frame of the present disclosure, without having a roughening relaxation area, may be suitable for connection by solder connection or die attach material in the portion to be connected for conduction of semiconductor elements, may have excellent adhesion with sealing resin when a semiconductor package is manufactured by resin sealing, and may be manufactured efficiently and at a low cost.

2 Claims, 4 Drawing Sheets

10

R1
R1

30
30

11
11

12
12

R2
R2

31
31

13
13

1
11
30
30
10
30

11
12
30
30
10
30

11
12
13
13
10
13

10a
11
10a
13
13
10
13

LEAD FRAME

CROSS-REFERENCE TO RELATED PATENT APPLICATIONS

This application claims the benefit of Japanese Patent Application No. 2023-076372 filed in Japan on May 2, 2023, the contents of which are incorporated herein by reference.

BACKGROUND ART

1) Technical Field

The present disclosure relates to a lead frame used for a resin-sealed semiconductor package, and to a method for manufacturing the same.

2) Description of Related Art

In general, a resin-sealed semiconductor package uses a metal lead frame and a sealing resin. And a copper alloy material is mainly used as a substrate of the lead frame. An epoxy resin is mainly used as the sealing resin. This type of semiconductor package may cause problems in adhesion between the lead frame surface and the sealing resin. In a case of wire bonding mounting, there is a problem that a solvent of a die attach material, which is a paste for bonding semiconductor elements to connect them, seeps out and damages the adhesiveness with the sealing resin. In a case of flip chip mounting, when a solder is used to make electrical connections, there are problems of solder spreading and causing short circuits, and the spreading of solder further deteriorating adhesion with the sealing resin.

Therefore, to improve adhesion to the sealing resin in the lead frame used for the resin-sealed semiconductor package, it is known to apply roughening treatment such as formation of an anodic oxide film on the whole surface except a portion requiring connection for conduction of the semiconductor element.

For example, the following Patent literature 1 discloses a technique for forming a silver plating layer on a portion to be electrically connected, forming an anodic oxide film on the entire surface of the lead frame substrate where no silver plating layer is formed, and then peeling off the silver plating layer.

However, when roughening treatment is applied to the surface of the lead frame, there may be problems that the solvent component contained in the die attach material used for fixing the semiconductor element to the lead frame mounting surface may easily wet and spread by capillarity over the roughened surface formed on the surface of the lead frame, the wet and spread solvent component reduces the adhesion between the lead frame and the sealing resin, and the wire bonding may be inhibited when performing wire bonding.

Further, Patent literature 2 discloses a lead frame that has two types of roughened surfaces, a roughened area and a roughened relaxation area with higher flatness than the roughened area, the roughened relaxation area being formed by crushing a portion of the formed roughened area. The lead frame suppresses the wetting and spreading of the solvent component by capillarity, suppresses adhesion reduction with resin and avoids wire bonding failure.

PRIOR ART LITERATURE

Patent Literature

Patent literature 1: JP Patent Laid-Open No. 2021-019095
Patent literature 2: JP Patent Laid-Open No. 2022-103594

SUMMARY OF THE INVENTION

Problem to be Solved by the Invention

In the manufacturing method of the lead frame disclosed in Patent literature 2, a lead frame is shaped by a metal plate, a plating layer that is partially capable of bonding wires is formed on the lead frame, then the entire surface of the lead frame with the plating layer is roughened to form a roughening area, and then a mold is used to press a portion of the roughening area to form the roughening relaxation area by pressing.

However, the technique disclosed in Patent literature 2 requires a pressing process to form a roughening relaxation area using a mold after forming the roughening area, which increases the manufacturing process and reduces manufacturing efficiency, and requires manufacturing facilities for the pressing process using a mold, which increases costs.

When solder is used for electrical connection, for example, it is known that solder bonding directly to copper material has stronger bonding than solder bonding via connection plating layers, which are laminated in the order of nickel plating, palladium plating, and gold plating. There is a need for a lead frame in which a plating layer and a copper material both for electrical connection are exposed at portions to be soldered and an anodic oxide film is provided on the other surfaces.

The present disclosure was made in view of the above-mentioned conventional problems. The object of the present disclosure is to provide a lead frame and a manufacturing method thereof, which are suitable for connection by solder connection or die attach material at a portion to be connected for conduction of semiconductor elements without having a roughening relaxation area, have excellent adhesiveness with sealing resin when a semiconductor package is manufactured by resin sealing, and may be manufactured efficiently and cost-effectively.

Solution to Problem

In order to achieve the above-mentioned purpose, the lead frame according to the present disclosure is a lead frame formed of a plate-shaped copper material, comprising: a smooth surface with a surface area ratio of 1.0 to 1.3 being provided at least one surface of the plate-shaped copper material; a predetermined connection plating layer being provided at a portion to be connected for conduction of a semiconductor element on the smooth surface of the plate-shaped copper material; a portion where the smooth surface of the copper material being annularly exposed with a width of 5 to 20 micrometers being provided around the connection plating layer; and an anodic oxide film with a surface area ratio of 1.7 to 2.3 being provided at other portions, wherein the anodic oxide film is formed of a monolayer film, having a needle-shaped crystal structure of a copper oxide film with an average length of 200 nanometers or more, composed of a mixture of cuprous oxide ($Cu_2O$), cupric oxide (CuO) and cupric hydroxide ($Cu(OH)_2$).

In the lead frame of the present disclosure, the connection plating layer is preferably comprising a plating layer formed by laminating nickel plating, palladium plating, and gold plating on the plate-shaped copper material in this order.

The method for manufacturing a lead frame according to the present disclosure comprises: a process of preparing a plate-shaped copper material at least one side of which comprises a smooth surface with a surface area ratio of 1.0 to 1.3; a process of forming a plating resist mask on the side comprising the smooth surface of the plate-shaped copper material, wherein the plating resist mask in which a portion corresponding to a portion to be connected as a lead frame for conduction of a semiconductor element is opened; a process of forming a predetermined connection plating layer on the plate-shaped copper material exposed through apertures in the plating resist mask; a process of forming a silver plating layer covering the plate-shaped copper material under the plating resist mask around the connection plating layer, covering the top and side surfaces of the connection plating layer, using a silver plating bath having properties of penetrating into an interface between the plating resist mask and the connection plating layer and an interface between the plating resist mask and the plate-shaped copper material around the connection plating layer; a process of removing the plating resist mask; and a process of forming the plate-shaped copper material formed the silver plating layer into the lead frame shape; a process of immersing the plate-shaped copper material formed into the lead frame shape in an alkaline solution to remove an oxide film on the surface; a process of immersing the plate-shaped copper material from which the oxide film has been removed, in a blackening treatment solution as an anode to form an anodic oxide film with a surface area ratio of 1.7 to 2.3 on a portion of the plate-shaped copper material not covered by the silver plating layer; and a process of peeling off the silver plating layer to expose the smooth surface of the copper material around the connection plating layer in an annular shape.

In the lead frame manufacturing method, to form the anodic oxide film at a low current density of 1.5 $A/dm^2$ or less is preferable.

In the lead frame manufacturing method, the silver plating bath is preferably a high-cyanide bath.

In the lead frame manufacturing method, the connection plating layer is preferably formed by laminating nickel plating, palladium plating, and gold plating on the plate-shaped copper material in this order.

Effect of the Invention

According to the present disclosure and its manufacturing method, without having a roughening relaxation area, a lead frame may be produced efficiently and cost-effectively, suitable for connection of semiconductor elements and conduction by solder connection or die attach material, and excellent in adhesion with sealing resin when a semiconductor package is manufactured by resin sealing.

BRIEF DESCRIPTION OF DRAWINGS

FIG. 1A is a plan view, FIG. 1B is a partially enlarged view of FIG. 1A.

FIG. 2A is a plan view, FIG. 2B is a partially enlarged view of FIG. 2A.

FIG. 4A is a plan view seen from one surface side, and FIG. 4B is a plan view seen from the other side.

DETAILED DESCRIPTION OF PREFERRED EMBODIMENTS

Figure 1A:
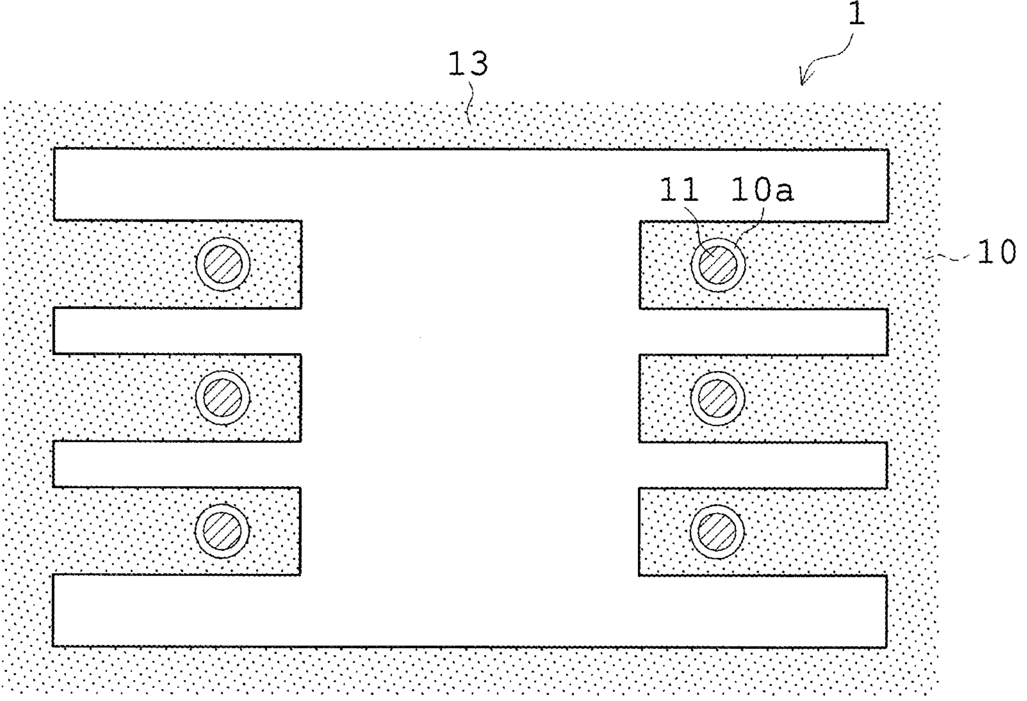
FIGS. 1A-1B are a set of explanatory diagrams schematically showing one example of a lead frame for flip chip mounting manufactured by a method of manufacturing a lead frame according to an embodiment of the present disclosure from one surface side.
Figure 1B:
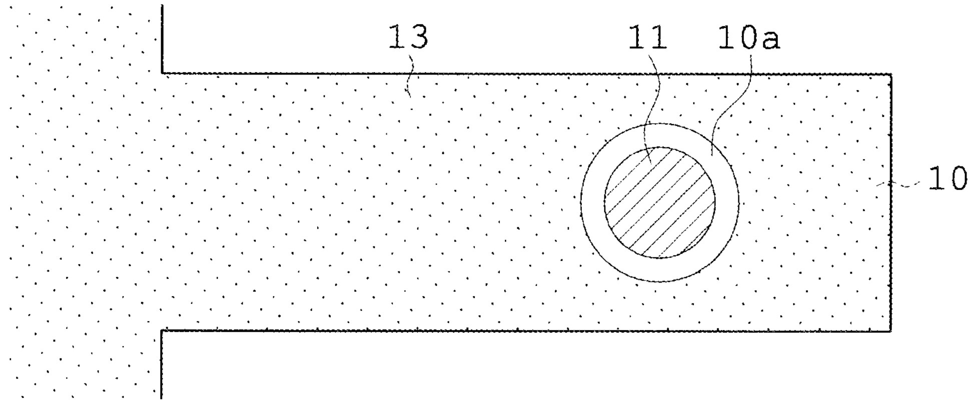
Figure 2A:
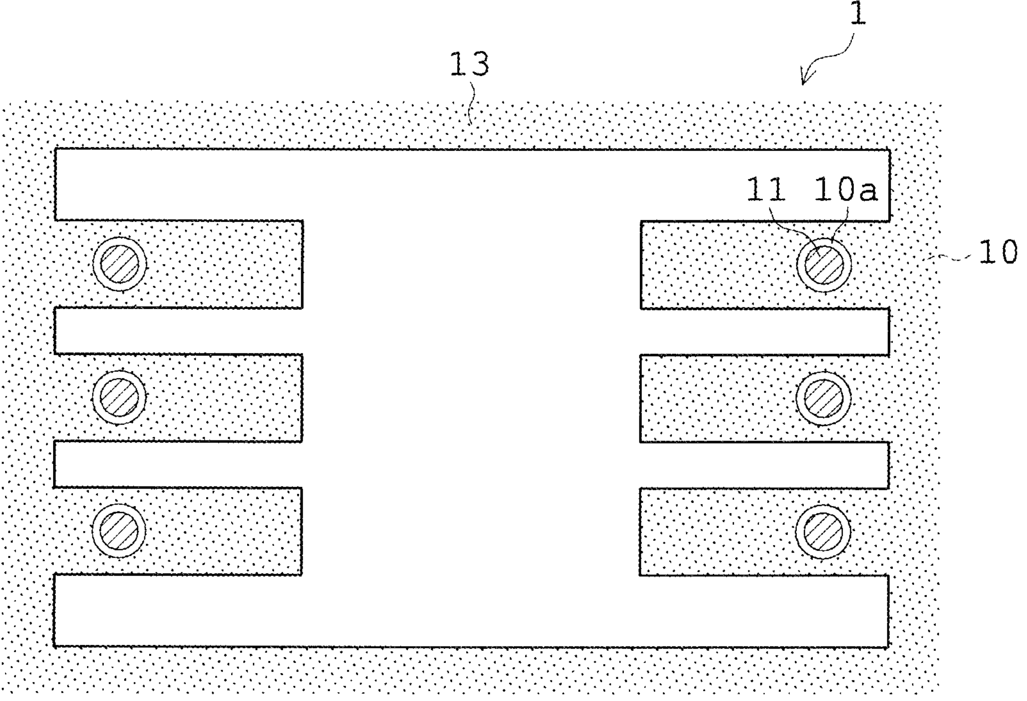
FIGS. 2A-2B are a set of explanatory diagrams schematically showing an example of a lead frame for flip-chip mounting manufactured by a lead frame manufacturing method according to an embodiment of the present disclosure from the other surface side.
Figure 2B:
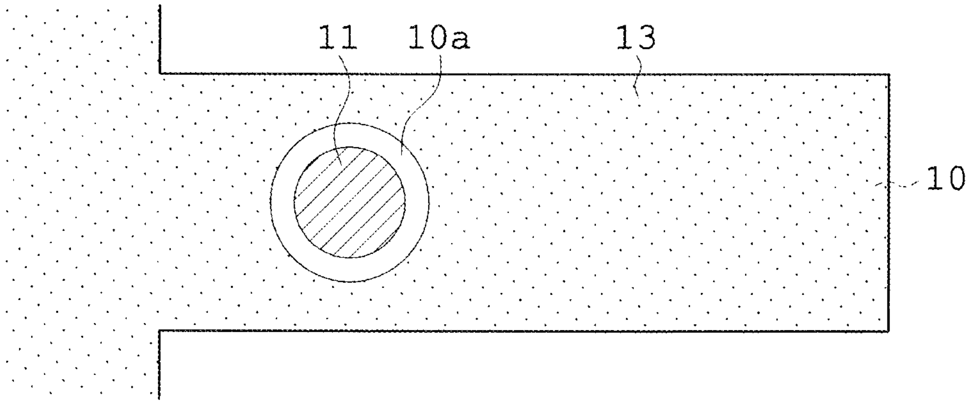

Prior to the description of the embodiment, the background leading to the derivation of the present disclosure and the effects of the disclosure will be explained.

The technique disclosed in Patent literature 1 was filed by the applicant of this application and was invented by inventors other than the inventors of this application.

In this technique, as a measure for manufacturing a lead frame in which a metal plate is exposed in a portion where connection is required for conduction of semiconductor elements and an oxide film is formed on the entire surface except for the portion where connection is required, in the process of repeating trial and error, a plating layer that may reduce the manufacturing cost and prevent masking from peeling off even when immersed in a blackening treatment solution for forming an anodic oxide film was reviewed, and using a silver plating layer was derived.

Therefore, using the technique of this patent literature 1, the inventors have studied the following in order to obtain a lead frame that is suitable for connection by solder connection or die attach material in the portion to be connected for conduction of semiconductor elements without having a roughening relaxation area, and has excellent adhesion with sealing resin when a semiconductor package is manufactured by resin sealing.

First, using the technique of Patent Literature 1, the inventors of this disclosure tried, for example, by forming a silver plating layer of the same size over the connection plating layer, which is layered in the order of nickel plating, palladium plating, and gold plating in the portion requiring connection, to remove the silver plating layer after forming an anodic oxide film using the silver plating layer as a mask.

However, such a method cannot solve the problem that, for example, the anode oxide film becomes close to the periphery of the connection plating layer stacked in the portion where connection is required, and the solvent component in the die attach material, which used to fix the semiconductor elements to the lead frame mounting surface, wet and spread the roughened surface formed on the lead frame surface by capillary action to reduce adhesion with the sealing resin.

Moreover, if a silver plating layer of the same size is formed over the connection plating layer stacked in the area where connection is required, copper ions are easily eluted in the blackening treatment solution used to form an anodic oxide film on the exposed surface of the metal plate, such as the plate-shaped copper material, to discolor the side of the connection plating layer along with the silver plating layer. Even if the silver plating layer is removed, the lead frame will have a discolored peripheral portion of the connection plating layer, which reduces the suitability of the connection plating layer and significantly loses its value of a product.

Therefore, the inventors of this disclosure considered it necessary to provide an area between the connection plating layer and the anodic oxide film corresponding to the roughening relaxation area described in Patent literature 2.

However, providing a roughening relaxation area as described in Patent literature 2 requires a process of pressing a portion of the roughened area using a mold, which increases the number of manufacturing processes and reduces manufacturing efficiency, and also requires manufacturing facilities for the pressing process using a mold, resulting in high costs.

Therefore, the inventors in this study examined measures to prevent the spread of solvent components contained in the die attach material over the roughened surface forming the anodic oxide film by capillary action without providing a roughening relaxation area. By forming a larger silver plating layer that extends around the connection plating layer and removing the silver plating layer after forming the anodic oxide film, a smooth surface of the lead frame substrate is provided between the connection plating layer and the anodic oxide film, and this smooth surface is used to connect semiconductor elements for connection and continuity. This smooth surface prevents the spread by capillary action of solvent components contained in the die attach material over the roughened surface that forms the anodic oxide film when connecting and conducting semiconductor elements.

In addition to use the technique of the Patent literature 1, the inventors considered forming a lead frame by separately forming a plating resist mask for the connection plating layer and another plating resist mask for the silver plating layer in order to form a larger silver plating layer so as to extend around the connection plating layer, and made the following first prototype.

<First Prototype>

A plate-shaped copper material having a thickness of 0.2 mm was prepared for lead frames having a surface area ratio of 1.3 or less and having smooth surfaces on both sides.

A first plating resist mask was formed on the plate-shaped copper material with an aperture in the portion corresponding to the connection plating layer as a lead frame, and nickel plating, palladium plating, and gold plating were performed in this order to form the connection plating layer.

The first plating resist mask is peeled off, and then a second plating resist mask having an aperture of 20 micrometers wider than the periphery of the formed connection plating layer was formed on one side, a silver plating layer was formed over the top and side surfaces of the previously formed connection plating layer and over the plate-shaped copper material up to an area of 20 micrometers surrounding the connection plating layer, and then the second plating resist mask was removed.

Next, an etching resist mask with a predetermined lead frame shape aperture was formed on the plate-shaped copper material on which the silver plating layer is formed, and an etching process was performed to form the lead frame shape.

Next, the etching resist mask was removed and the surface of the plate-shaped copper material formed into the lead frame shape was cleaned with an alkaline solution to promote anodic oxide film growth.

Next, the plate-shaped copper material as an anode formed in the shape of a lead frame was immersed in the blackening treatment solution to form an anodic oxide film with a surface area ratio of 1.7 to 2.3 on the surface of the plate-shaped copper material without the silver plating layer.

Then, a lead frame was obtained comprising a connection plating layer in the portion where connection was required, the connection plating layer being provided by peeling off the silver-plated layer; a portion in which the smooth surface of copper material is annularly exposed around the connection plating layer; and an anodic oxide film formed of the copper material in the other portions.

When the anodic oxide film is formed by the blackening treatment solution at a high current density, short needle-shaped crystals are formed and the surface area ratio is less than 1.5, but when formed at a low current density, the oxide film is a mixture of long and short needle-shaped crystals and the surface area ratio is 1.7 or higher. In this trial, an anodic oxide film was formed at a current density of 1.5 A/dm2 or lower.

In the first prototype, it was confirmed that a lead frame that may prevent the spread by capillary action of solvent components in the die attach material over the roughened surface forming the anodic oxide film may be obtained without providing a roughening relaxation area.

However, the process of forming the first plating resist mask and the second plating resist mask is separately necessary. The additional process of forming the second plating resist mask proved to be difficult to adopt for mass production due to the high manufacturing cost.

Therefore, the inventors have studied a method to form a larger silver plating layer around the connection plating layer without making a plating resist mask twice.

In the course of their study, the inventors focused on the fact that a high cyanide silver plating bath is generally unsuitable for partial plating because the high cyanide silver plating bath easily deteriorates the resist mask. And then the inventors thought that the silver plating solution could penetrate the interface between the plating resist mask and the connection plating layer and the interface between the plating resist mask and the plate-shaped copper material around the connection plating layer by reversing the characteristic of this high cyanide silver plating bath that easily deteriorates the resist mask during partial plating.

The inventors thought that if the silver plating solution may penetrate between the side surface of the connection plating layer and the side surface of the resist mask, and further penetrate under the resist mask, the copper material around the connection plating layer may be partially covered with silver plating, preventing discoloration due to contamination of the connection plating layer by copper ions eluted in the blackening solution when forming the anodic oxide film, and also preventing the spread of solvent components contained in the die attach material over the roughened surface forming the anodic oxide film by capillary action.

<Second Prototype>

Therefore, as the second trial, the inventors prepared a plate-shaped copper material similar to the first trial, formed a similar first plating resist mask on the plate copper material, plated nickel plating, palladium plating, and gold plating in this order, and formed a connection plating layer, and then formed a silver plating layer using a high cyanide silver plating bath without removing the first resist mask. After forming the connection plating layer, a silver plating layer was formed using a high cyanide silver plating bath without removing the first resist mask. After the silver plating layer was formed, the lead frame shape was shaped as in the first prototype, the anodic oxide film was formed, the silver plating layer was peeled off, and the lead frame was obtained.

The lead frames fabricated from the second prototype had a connection plating layer in the portion where connections were required, and a smooth surface of copper material was exposed in an annular shape around the connection plating layer, and an anodic oxide film of copper material was formed in other portions. The periphery of the connection plating layer was not contaminated by copper ions, and no discoloration was observed.

The inventors have thus obtained confirmation that when a silver plating layer is formed using a high cyanide silver plating bath with the resist mask used to form the connection plating layer as it is, a silver plating layer is formed over a wider portion than the connection plating layer, which is formed by using the same plating resist mask as the plating layer lower than the silver plating layer.

This is considered to be a phenomenon where the silver plating solution penetrates the interface between the plating resist mask and the connection plating layer and the interface between the plating resist mask and the plate-shaped copper material around the connection plating layer, forming a silver plating layer.

In the second trial, the silver plating layer was formed to be 1 micrometer thick. The thickness of the resist mask was 2 micrometers.

The copper material exposed around the connection plating layer generally had a smooth surface exposed in an annular shape with a width of 5 to 20 micrometers.

Through such trial and error, the inventors of the present disclosure have confirmed to be able to obtain a lead frame that may prevent discoloration due to copper ion contamination of the peripheral edge portion of the connection plating layer provided in a portion where connection is required without providing a roughening relaxation area and without using a second plating resist mask, and have confirmed to be able to obtain a lead frame that may also prevent the spread of the solvent component contained in the die attach material used when connecting the semiconductor elements to the roughened surface forming the anodic oxide film due to capillary action, leading to the lead frame and its manufacturing method of the present disclosure.

The lead frame of the present disclosure is a lead frame formed by using a plate-shaped copper material, comprising: a smooth surface with a surface area ratio of 1.0 to 1.3 being provided at least one surface of the plate-shaped copper material; a predetermined connection plating layer being provided at a portion to be connected for conduction of a semiconductor element on the smooth surface of the plate-shaped copper material; a portion where the smooth surface of the copper material being annularly exposed with a width of 5 to 20 micrometers being provided around the connection plating layer; and an anodic oxide film with a surface area ratio of 1.7 to 2.3 being provided at other portions, wherein the anodic oxide film is formed of a monolayer film, having a needle-shaped crystal structure of a copper oxide film with an average length of 200 nanometers or more, composed of a mixture of cuprous oxide ($Cu_2O$), cupric oxide (CuO) and cupric hydroxide ($Cu(OH)_2$).

The lead frame of the present disclosure is provided with the portion where the smooth surface of the copper material with the surface area ratio of 1.0 to 1.3 being annularly exposed with the width of 5 to 20 micrometers around the predetermined connection plating layer that is provided at the portion to be connected for conduction of semiconductor elements; of the present disclosure is further provided with the anodic oxide film with the surface area ratio of 1.7 to 2.3 at other portions, wherein the anodic oxide film is formed of the monolayer film, having the needle-shaped crystal structure of the copper oxide film with the average length of 200 nanometers or more, composed of the mixture of cuprous oxide ($Cu_2O$), cupric oxide (CuO) and cupric hydroxide ($Cu(OH)_2$). According to the lead frame of the present disclosure with these configurations, the smooth surface between the connection plating layer and the anodic oxide film prevents solvent components contained in the die attach material used for connecting the connection plating layer and the semiconductor elements from entering the anodic oxide film by capillary action of the anodic oxide film. Therefore, the adhesion with the sealing resin may be made excellent when the semiconductor package is manufactured by resin sealing.

In addition, if, as in the lead frame of the present disclosure, the lead frame is configured with a portion where the smooth surface of the copper material is exposed in an annular shape around a predetermined connection plating layer in the portion to be connected for conduction of semiconductor elements, the smooth surface of the plate-shaped copper material used for manufacturing the lead frame may be used as it is, thereby reducing the manufacturing process, improving manufacturing efficiency, eliminating the need for manufacturing equipment, and reducing costs.

In the lead frame of the present disclosure, as the lead frame is comprising the smooth surface of the copper material with the surface area ratio of 1.0 to 1.3, and the anodic oxide film with the surface area ratio of 1.7 to 2.3, so that excellent adhesion to the sealing resin may be provided and the spread of solvent components contained in the die attach material used to connect the semiconductor elements over the anodic oxide film may be prevented.

The lead frame of the present disclosure preferably comprises a plating layer formed by laminating nickel plating, palladium plating, and gold plating on the plate-shaped copper material in this order.

In this configuration, the lead frame of the present disclosure may be achieved with both the connection plating layer and the copper material exposed at the portion where solder joints are made for electrical conduction of semiconductor elements, and with an anodic oxide film on other surfaces.

A lead frame manufacturing method of the present disclosure also includes the following processes: a process of preparing a plate-shaped copper material, wherein at least at least one side of the plate-shaped copper material comprises a smooth surface with a surface area ratio of 1.0 to 1.3; a process of forming a plating resist mask on the smooth side of the plate-shaped copper material, wherein a resist mask for plating in which a portion corresponding to a portion to be connected as a lead frame for conduction or conduction of a semiconductor element is opened; a process of forming a predetermined connection plating layer on the plate-shaped copper material exposed through apertures in the plating resist mask; a process of forming silver plating layer covering the plate-shaped copper material under the plating resist mask around the connection plating layer, and covering the top and side surfaces of the connection plating layer, using a silver plating bath having a property of penetrating into an interface between the plating resist mask and the connection plating layer and an interface between the plating resist mask and the plate-shaped copper material around the connection plating layer; a process of removing the plating resist mask; a process of forming the plate-shaped copper material formed the silver plating layer into the lead frame shape; a process of immersing the plate-shaped copper material formed into the lead frame shape in an alkaline solution to remove an oxide film from the surface; a process of immersing the plate-shaped copper material from which the oxide film has been removed, in a blackening treatment solution as an anode to form an anodic oxide film, with a surface area ratio of 1.7 to 2.3 on a portion of the plate-shaped copper material not covered by the silver plating layer; and a process of peeling off the silver plating layer to expose the smooth surface of the copper material around the connection plating layer in annular shape.

This configuration allows the smooth surface of the copper material to be exposed in an annular shape around the connection plating layer provided at the portion where connection is required for conduction of semiconductor elements, and an anodic oxide film of the copper material to be formed at other portions, without providing a roughening relaxation area as in the technique described in the Patent literature 2, and also prevents discoloration due to copper ion contamination of the periphery of the connection plating layer. Furthermore, in the manufacturing process, there is no need to form separate plating resist masks for the connection plating layer and the silver plating layer, and the same plating resist mask may be used for both.

Therefore, the lead frames are suitable for connection of semiconductor elements for conduction by solder connection or die attach material, and have excellent adhesion with sealing resin when a semiconductor package is manufactured by resin sealing, and may be manufactured efficiently and cost-effectively.

In the lead frame manufacturing method of the present disclosure, the anodic oxide film is preferably formed at a low current density of 1.5 A/dm2 or less.

This configuration results in an oxide film with a mixture of long and short needle-shaped crystals and an anodic oxide film with a surface area ratio of 1.7 or more, which prevents the anodic oxide film from peeling off and improves the degree of adhesion with the sealing resin.

In the lead frame manufacturing method of the present disclosure, the silver plating bath is preferably a high cyanide bath.

In this configuration, it is possible to achieve a silver plating bath having characteristics to penetrate the interface between the plating resist mask and the connection plating layer and the interface between the plating resist mask and the plate-shaped copper material around the connection plating layer in the lead frame manufacturing method of the present disclosure.

In the lead frame manufacturing method of the present disclosure, the connection plating layer is preferably formed by laminating nickel plating, palladium plating, and gold plating on the plate-shaped copper material in this order.

This configuration allows the lead frame manufacturing method of the present disclosure to be achieved with both the connection plating layer and the copper material exposed at the portion where solder joints are made or where semiconductor elements are mounted, and with an anodic oxide film on the other surfaces.

Therefore, according to the present disclosure, the lead frame and its manufacturing method may be obtained, being suitable for connection by solder connection or die attach material in the portion to be connected for conduction of semiconductor elements without having roughening relaxation area, having excellent adhesion with sealing resin when a semiconductor package is manufactured by resin sealing, and being manufactured efficiently and at a low cost.

It is preferable to perform soft etching before forming the connection plating layer, and to perform etching to a depth of less than 5 micrometers, which facilitates solder retention during solder reflow.

The following is a description of an embodiment of the present disclosure with reference to the drawings.

The lead frame of this embodiment is a lead frame formed by using a plate-shaped copper material, at least one side of which is a smooth surface. A predetermined connection plating layer is provided at the portion on the smooth side of the plate-shaped copper material that is to be connected for conduction of semiconductor elements, and the smooth side of the copper material is annularly exposed around the connection plating layer. An anodic oxide film of the copper material is provided in other portions.

The lead frame of this embodiment may be applied to lead frames of various shapes, and the shape of the lead frame of this embodiment is not limited, but for the sake of convenience, a lead frame of the shapes shown in FIGS. 1A-1B and FIGS. 2A-2B will be used as an example.

The lead frame 1 shown in FIGS. 1A-1B and FIGS. 2A-2B is made of copper or copper alloy as a strip metal material, and a plate-shaped copper substrate 10 having smooth surfaces on both sides is formed into a predetermined shape by etching or pressing. The connection plating layer 11 is formed by laminating a nickel plating layer, a palladium plating layer, and a gold plating layer in this order. Around the connection plating layer 11, there is a portion 10*a* where the smooth surface of the copper material is exposed in an annular shape. In addition, an anodic oxide film 13 of the copper material is formed on the connection plating layer 11 and on other portions of the portion 10*a* where the smooth surface of the copper material is ring-shaped and exposed. The anodic oxide film 13 comprises a monolayer film of copper oxide, which is a mixture of cuprous oxide ($Cu_2O$), cupric oxide (CuO) and cupric hydroxide ($Cu(OH)_2$), and the monolayer film comprises a copper oxide film with a needle-shaped crystal structure with an average length of 200 nanometers or more.

Next, the lead frame manufacturing method of this embodiment, configured as shown in FIGS. 1A-18 and FIGS. 2A-2B, will be explained using FIGS. 3A-3L and FIGS. 3D'-3E' to 3K'-3L', illustrating a partial view for convenience.

Figures 3A, 3B, 3C, 3D, 3E, 3F, 3G, 3H, 3I, 3J, 3K, 3L:
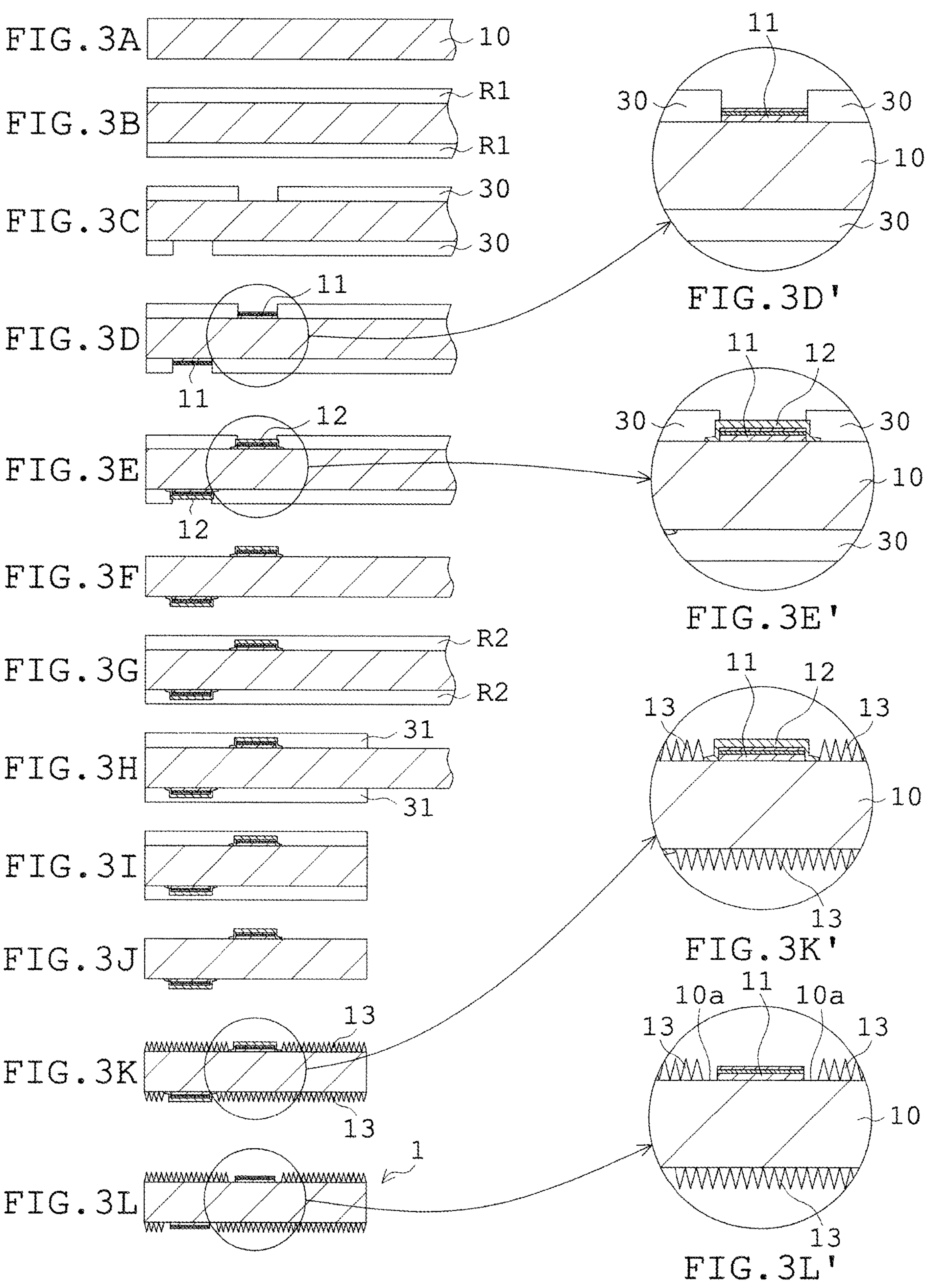
FIGS. 3A-3L and FIGS. 3D'-3E' to 3K'-3L' are a set of explanatory diagrams showing an example of a manufacturing process of a lead frame for flip-chip mounting according to an embodiment of the present disclosure.

In this embodiment of the manufacturing method, first, a plate-shaped copper substrate 10 made of copper or copper alloy as a strip metal material and having smooth surfaces with a surface area ratio of 1.0 to 1.3 on both sides is prepared as a lead frame material (see FIG. 3A).

Next, a resist layer R1 such as dry film resist is formed on both sides of the plate-shaped copper substrate 10 (see FIG. 3B).

Next, a pattern corresponding to an aperture in the resist layer R1 on the upper side is drawn on the resist layer R1 as a portion that electrically connects with the electrode of the semiconductor elements in flip chip mounting, and a pattern corresponding to an aperture in the resist layer R1 on the lower side as the portion that electrically connects with an external device. The resist layer R1 on both sides is exposed and developed using a glass mask with the patterns corresponding to the aperture in the resist layer R1 on the bottom side, which corresponds to the portions that electrically connect to the external device (see FIG. 3C) to form a plating resist mask 30.

Next, a connection plating layer 11 is formed on the surface of the plate-shaped copper substrate 10 exposed through the aperture of the plating resist mask 30 in the order of nickel plating, palladium plating, and gold plating (see FIGS. 3D and 3D').

Next, a silver plating bath (for example, high cyanide plating bath) having a property to penetrate an interface between the plating resist mask 30 and the connection plating layer 11 and an interface between the plating resist mask 30 and the plate-shaped copper substrate 10 around the connection plating layer 11 is used to cover the top and sides of the connection plating layer 11, as well as to The silver plating bath (for example high cyanide plating bath) is used to form a silver plating layer 12 that covers the top and sides of the connection plating layer 11 as well as the plate-shaped copper material under the plating resist mask 30 around the connection plating layer 11 (see FIG. 3E and FIG. 3E').

Next, the plating resist mask 30 is removed (see FIG. 3F).

Next, a resist layer R2 such as a dry film resist is formed on both sides of the plate-shaped copper substrate 10 on which the connection plating layer 11 and the silver plating layer 12 are formed (see FIG. 3G).

Next, using a glass mask on which a predetermined lead frame-shaped pattern is drawn, the resist layers R2 on both sides are exposed and developed to form an etching resist mask 31 (see FIG. 3H).

Next, an etching process is performed using an etchant to form a plate-shaped copper substrate 10 partially formed with a silver plating layer 12 into a predetermined lead frame shape (see FIG. 3I).

Next, the etching resist mask 31 is removed (see FIG. 3J).

As a result, on the upper surface side of the plate-shaped copper substrate 10, a connection plating layer 11 is formed on the portion electrically connected to the electrode of the semiconductor elements, a silver plating layer 12 is formed on the upper surface, side surfaces and around the connection plating layer 11, and on the lower surface side, a connection plating layer 11 is formed on a portion to be electrically connected to an external device, and a silver plating layer 12 is formed on the upper surface, side surfaces and around the connection plating layer 11, and a smooth surface is exposed over the entire surface of the other portions.

Next, a lead frame substrate 10 formed of plate-shaped copper material on which a silver plating layer 12 is partially formed is immersed in the blackening treatment solution, and the metal plate is energized as an anode in the lead frame substrate 10 to form an anodic oxide film 13 on the entire surface of the lead frame substrate 10, excluding the portion where the silver plating layer 12 covering the connection plating layer 11 is formed. An anodic oxide film 13 with a surface area ratio of 1.7 to 2.3 is formed (see FIGS. 3K and 3K').

Next, the silver plating layer 12 is peeled off to expose the smooth surface of the copper substrate 10 in an annular shape around the connection plating layer 11 (see FIGS. 3L and 3L').

As a result, the lead frame shown in FIGS. 1A-1B and FIGS. 2A-28 may be obtained, having a connection plating layer 11 at the lead frame substrate 10 to be connected for conduction of semiconductor elements and a portion 10*a* with the smooth surface of copper material exposed in an annular shape around the portion with the connection plating layer 11, and an anodic oxide film 13 is formed on all other surfaces.

Figure 4A:
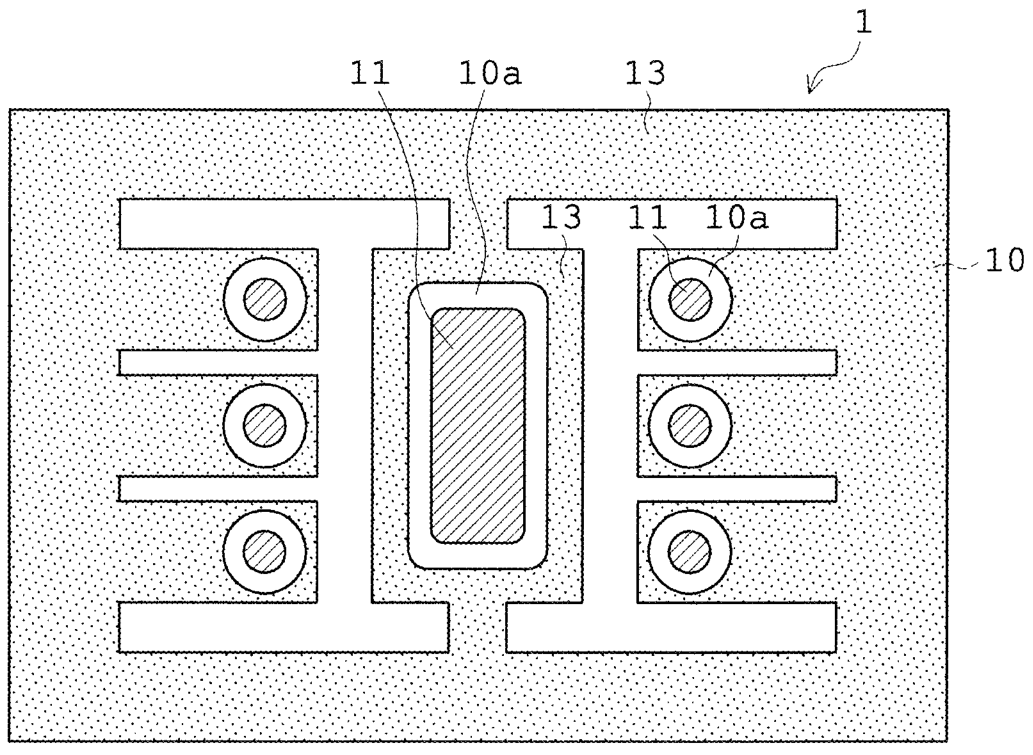
FIGS. 4A-4B are a set of explanatory diagrams schematically showing a lead frame for wire bonding as another example of the lead frame manufactured by the lead frame manufacturing method according to an embodiment of the present disclosure.
Figure 4B:
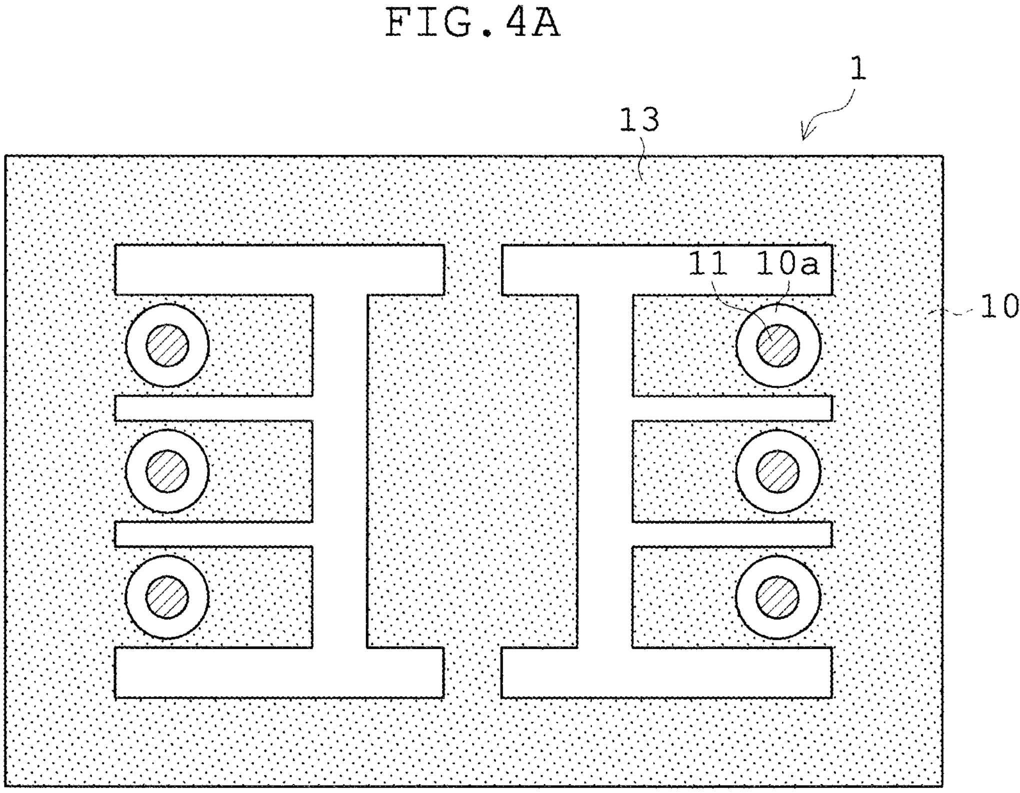

In addition to the lead frame 1 for flip chip mounting shown in FIGS. 1A-1B and FIGS. 2A-2B, the lead frame of this embodiment may be applied to a lead frame 1 for wire-bonding connection, as shown in FIGS. 4A-4B, for example. The lead frame 1 shown in FIGS. 4A-4B comprises a pad portion located at the center of the top side of the lead frame substrate that connects to the semiconductor elements via die attach material, a lead portion located around the pad portion that electrically connects to the electrode of the semiconductor elements by wire bonding. The connection plating layer 11 is formed in the order of nickel plating layer, palladium plating layer, and gold plating layer at each of the pad portion and the portion on the bottom side that is connected to external devices. Around the connection plating layer 11 in the pad portion, the lead frame 1 has a portion 10*a* where the smooth surface of the copper material is exposed in an annular shape. In addition, an anodic oxide film 13 of the copper material is formed on connection plating layer 11 on the top side of the pad portion, on other portions of the portion 10*a* where the smooth surface of the copper material is annularly exposed, and on the entire back side surface of the pad portion. The other compositions are roughly the same as those of the lead frame 1 for flip chip mounting shown in FIGS. 1-1B and FIGS. 2A-2B.

According to the lead frame 1 of this embodiment, since the connection plating layer 11 is provided at the portion to be connected for conduction of semiconductor elements, the lead frame 1 has a portion 10*a* with a smooth surface of copper substrate 10 exposed in an annular shape around the portion with the connection plating layer 11, and has an anodic oxide film 13 of copper material 10 at the other portions, the smooth surface between the connection plating layer 11 and the anodic oxide film 13 improves the bonding strength of the solder used for electrical connection with the connection plating layer 11, and prevents solvent components contained in the die attach material used for mounting semiconductor elements from entering through the capillary phenomenon of the anodic oxide film 13. Therefore, the adhesion with the sealing resin may be made excellent when the semiconductor package is manufactured by resin sealing.

According to the lead frame 1 of this embodiment, the lead frame is configured so that the smooth surface of the copper substrate 10 is exposed in an annular shape around the portion having the connection plating layer 11 at the portion to be connected for conduction of semiconductor elements, so the smooth surface provided on the copper substrate 10 in plate form used for manufacturing the lead frame may be used as is. This eliminates the need for a pressing process to form a roughening relaxation area using a mold after forming a roughened surface, as in the Patent literature 2, thereby reducing the number of manufacturing processes and improving manufacturing efficiency, as well as reducing costs by eliminating the need for manufacturing facilities.

According to the lead frame 1 of this embodiment, the surface area ratio of the smooth surface of the copper substrate 10 is 1.0 to 1.3 and the surface area ratio of the anodic oxide film 13 is 1.7 to 2.3, which provides excellent adhesion of the sealing resin and improves the bonding strength of the solder used for the electrically connected portions, and also prevents the spread of solvent components contained in the die attach material used for mounting the semiconductor elements over the anodic oxide film.

According to the lead frame 1 of this embodiment, the connection plating layer 11 comprises a plating layer formed by laminating nickel plating, palladium plating, and gold plating in this order on a plate-shaped copper substrate 10, so that both the connection plating layer and the copper material are exposed in the portion where solder joints and die attach materials are used to bond, and the lead frame with an anodic oxide film on other surfaces may be achieved.

The manufacturing method of the lead frame 1 in this embodiment is including the following processes: (1) preparing a plate-shaped copper substrate 10 of which both sides are comprising smooth surfaces having a surface area ratio of 1.0 to 1.3; (2) forming a plating resist mask 30 having apertures at portions corresponding to portions to be electrically connected as the lead frame on the smooth surface of the plate-shaped copper substrate 10; (3) forming a connection plating layer 11 on the portion of the plate-shaped copper substrate 10 exposed through the aperture of the plating resist mask 30; (4) forming a silver plating layer 12 that covers the top and side surfaces of the connection plating layer 11 and covers the plate-shaped copper substrate 10 below the plating resist mask 30 around the connection plating layer 11 using a high cyanide silver plating bath that has the property of penetrating into the interface between the plating resist mask 30 and the connection plating layer 11 and the interface between the plating resist mask 30 and the plate-shaped copper substrate 10 around the connection plating layer 11; (5) removing the plating resist mask 30; (6) forming the plate-shaped copper substrate 10 formed the silver plating layer 12 into a lead frame shape; (7) immersing the plate-shaped copper substrate 10 formed into a lead frame shape in an alkaline solution to remove an oxide film on the surface; (8) immersing the plate-shaped copper substrate 10 formed into a lead frame shape with the oxide film removed in a blackening treatment solution as an anode, and forming an anodic oxide film 13 with a surface area ratio of 1.7 to 2.3 on a portion of the plate-shaped copper substrate 10 formed in the lead frame shape that is not covered by the silver plating layer 12; and (9) peeling off the silver plating layer 12 to expose a smooth surface of the plate-shaped copper substrate 10 in around the connection plating layer 11 in an annular shape.

Therefore, according to the manufacturing method of the lead frame 1 in this embodiment, the lead frame may prevent discoloration due to copper ion contamination of the periphery of the connection plating layer provided in the portion where connection is required, without providing a roughening relaxation area as in the technique described in Patent literature 2. Furthermore, in the manufacturing process, there is no need to form separate plating resist masks for the formation of the connection plating layer and the formation of the silver plating layer, and the same plating resist mask may be used for both of the formation of the connection plating layer and the formation of the silver plating layer.

Therefore, according to the manufacturing method of lead frame 1 in this embodiment, lead frames may be obtained to be suitable for connection by solder or die attach materials, to have excellent adhesion with sealing resin when manufacturing semiconductor packages by resin sealing, and to be manufactured efficiently and cost-effectively.

According to the manufacturing method of the lead frame 1 in this embodiment, the anodic oxide film is formed at a low current density of 1.5 A/dm2 or less, which results in an oxide film with a mixture of long and short needle-shaped crystals and an anodic oxide film with a surface area ratio of 1.7 or more may be obtained, and the anodic oxide film does not peel off, and the degree of adhesion to the sealing resin may be increased.

According to the manufacturing method of the lead frame 1 in this embodiment, a high-cyanide bath is used for the silver plating bath, which may achieve a silver plating bath having a property of penetrating into the interface between the plating resist mask 30 and the connection plating layer 11 and the interface between the plating resist mask 30 and the plate-shaped copper substrate 10 surrounding the connection plating layer 11.

According to the manufacturing method of the lead frame 1 in this embodiment, the connection plating layer 11 is configured to be formed by laminating nickel plating, palladium plating, and gold plating on the plate-shaped copper substrate 10 in this order, so that the lead frame manufacturing method may achieve a lead frame having the connection plating layer and the copper substrate both exposed for electrical connection on the portion where semiconductor elements are connected or soldered, and having the anodic oxide film on the other portions of the surface.

Therefore, according to this embodiment, a lead frame and its manufacturing method may be obtained efficiently and cost-effectively without having a roughening relaxation area, suitable for connection by solder connection or die attach substrate in the portion to be connected for conduction of semiconductor elements, and excellent in adhesiveness with sealing resin when a semiconductor package is manufactured by resin sealing.

Embodied Example 1

A copper material (Furukawa Electric: EFTEC64T) with a thickness of 0.2 mm was prepared as a metal plate for a lead frame. The surface area ratio of the metal plate was 1.1. (Olympus short wavelength laser microscope OLS-4100)

A resist layer was formed by laminating a 25 micrometer thick dry film resist onto the surface of the prepared metal plate.

Next, a pattern corresponding to an aperture having approximately 0.1 mm diameter was drawn on the resist layer on the upper side as the portion corresponding to the portion electrically connected to the electrode of the semiconductor elements, and a pattern corresponding to an aperture having approximately 0.3 mm diameter on the resist layer on the lower side as the portion corresponding to the portion electrically connected to the external device. The plating resist mask was formed by exposing and developing the resist layers on both sides using a glass mask with patterns corresponding to apertures of approximately 0.3 mm diameter on the lower side of the resist layer.

Next, a 1 micrometer thick nickel plating layer was formed on the metal plate exposed through the apertures in the plating resist mask. On top of that, a palladium plating layer was formed to a thickness of approximately 0.03 micrometers, and finally a gold plating layer was formed to a thickness of approximately 0.003 micrometers to form the connection plating layer necessary for electrical connection.

Next, using a high cyanide silver plating bath mainly comprising silver cyanide and potassium cyanide, a silver plating layer of approximately 1 micrometer thick was formed by electrolytic plating on the metal plate exposed through the aperture of the plating resist mask, and the plating resist mask was removed.

Next, forming a resist layer, the same dry film resist was laminated to both sides of the metal plate on which the silver plating layer was formed.

Next, the resist layers on both sides were exposed and developed using a glass mask on which a predetermined lead frame-shaped pattern was drawn to form an etching resist mask.

Next, spray etching was performed using a ferric chloride solution to form a metal plate partially formed with a silver plating layer into a predetermined lead frame shape, and the etching resist mask was removed.

Next, using a commercially available blackening treatment solution, which is an alkaline solution, the metal plate formed into a predetermined lead frame shape was immersed with a density of 90 ml/l, a liquid temperature of room temperature, and a treatment time of 60 seconds.

Next, using the same commercially available blackening treatment solution, an anodic oxide film was formed on the entire surface subjected to immersion treatment with a metal plate as an anode at a density of 90 ml/l, a liquid temperature of 70 degrees Celsius, a treatment time of 2.5 minutes, and a current density of 0.5 A/dm2.

Next, using a commercially available removing solution, the silver plating layer contaminated with copper ions in the blackening treatment solution was removed.

Peeling off the silver plating layer, laminating a nickel plating layer, a palladium plating layer, and a gold plating layer as connection plating layers, and exposing the metal plate in an area of approximately 5 to 20 micrometers around it, a lead frame was obtained in which an anodic oxide film was formed on the entire surface of the metal plate formed in other predetermined lead frame shape.

The surface area ratio of the formed anodic oxide film was 1.7 to 2.3. In addition, no discoloration due to copper ion contamination in the blackening treatment solution used for forming the anodic oxide film was observed on the periphery of the connection plating layer, confirming that the product was of good quality.

The current density for forming the anodic oxide film used in Embodied Example 1 was 0.3 to 1.5 A/dm2, and the immersion time of 1 to 5 minutes was considered to be suitable.

Comparative Example 1

A lead frame of Comparative Example 1 was obtained using the same materials and manufacturing procedure as in Embodied Example 1, except that the plating bath used for forming the silver plating layer was a low-cyanide silver plating bath.

The lead frame of Comparative Example 1 was confirmed to be unsuitable as a product because discoloration due to contamination of the blackening treatment solution was observed on the periphery of the connection plating layer.

In addition, an anodic oxide film was formed in close proximity to the connection plating layer, and no area around the connection plating layer was formed where the smooth surface of the metal plate was exposed as in the lead frame of Embodied Example 1, the lead frame of Comparative Example 1 was confirmed to be unsuitable for solder connection or semiconductor elements mounting.

INDUSTRIAL APPLICABILITY

The lead frame of the present disclosure is useful in fields where lead frames used for manufacturing semiconductors to be encapsulated with sealing resin are required. In addition to lead frames in which the portion to be connected for conduction of semiconductor elements comprises a plating layer, the present disclosure may be also useful to lead frames in which metal plate such as plate-shaped copper material directly comprises the portion to be electrically connected.

The invention claimed is:

1. A lead frame formed of a plate-shaped copper substrate, comprising:

a smooth surface with a surface area ratio of 1.0 to 1.3 being provided on at least one surface of the plate-shaped copper substrate;

a predetermined connection plating layer being provided at a portion of the smooth surface of the plate-shaped copper substrate for conduction of a semiconductor element;

an annular portion, where the smooth surface of the plate-shaped copper substrate is annularly exposed, being provided around the predetermined connection plating layer, the annular portion having a width of 5 to 20 micrometers; and an anodic oxide film with a surface area ratio of 1.7 to 2.3 being provided on the at least one surface of the plate-shaped copper substrate outside of the smooth surface, wherein the anodic oxide film is formed of a monolayer film of copper oxide having needle-shaped crystal structures with an average length of more than 200 nanometers, the monolayer film of copper oxide being composed of a mixture of cuprous oxide ($Cu_2O$), cupric oxide (CuO) and cupric hydroxide ($Cu(OH)_2$).

2. The lead frame according to claim 1, wherein the connection plating layer is composed of a plating layer formed by laminating nickel plating, palladium plating, and gold plating on the plate-shaped copper substrate in this order.

* * * * *